United States Patent
Guo et al.

(10) Patent No.: US 6,861,854 B1
(45) Date of Patent: Mar. 1, 2005

(54) PEIZOELECTRIC MICROACTUATOR AND SENSOR FAILURE DETECTION IN DISK DRIVES

(75) Inventors: Wei Guo, Fremont, CA (US); Michael R. Hatch, Mountain View, CA (US)

(73) Assignee: Maxtor Corporation, Longmont, CO (US)

( * ) Notice: Subject to any disclaimer, the term of this patent is extended or adjusted under 35 U.S.C. 154(b) by 148 days.

(21) Appl. No.: 10/269,323

(22) Filed: Oct. 11, 2002

Related U.S. Application Data (63) Continuation of application No. 10/218,953, filed on Aug. 13, 2002, now abandoned.
(60) Provisional application No. 60/345,037, filed on Oct. 23, 2001.

(51) Int. Cl.[7] ............................................. G01R 29/22
(52) U.S. Cl. .................................... 324/727; 324/76.49
(58) Field of Search ....................... 73/1.38; 324/76.49, 324/109, 210, 727; 360/245

(56) References Cited

U.S. PATENT DOCUMENTS

| | | | | |
|---|---|---|---|---|
| 5,447,051 A | * | 9/1995 | Hanks et al. | 73/1.15 |
| 5,521,772 A | | 5/1996 | Lee et al. | 360/75 |
| 5,777,815 A | | 7/1998 | Kasiraj et al. | 360/75 |
| 6,005,736 A | | 12/1999 | Schreck | 360/75 |
| 6,064,540 A | | 5/2000 | Huang et al. | 360/75 |
| 6,100,623 A | | 8/2000 | Huang et al. | 360/317 |
| 6,269,687 B1 | | 8/2001 | Zhang et al. | 73/105 |
| 6,298,545 B1 | | 10/2001 | Mohajerani et al. | 29/603.03 |
| 6,310,746 B1 | | 10/2001 | Hawwa et al. | 360/97.01 |
| 6,335,850 B1 | * | 1/2002 | Dunfield et al. | 360/294.5 |
| 6,346,809 B1 | | 2/2002 | Karam, II | 324/210 |
| 6,556,028 B1 | * | 4/2003 | Umanskiy et al. | 324/727 |
| 6,629,448 B1 | * | 10/2003 | Cvancara | 73/1.38 |
| 6,639,411 B1 | * | 10/2003 | Thomsen | 324/537 |
| 6,661,619 B2 | * | 12/2003 | Nishida et al. | 360/294.4 |
| 2001/0040754 A1 | * | 11/2001 | Heaton et al. | 360/78.04 |

FOREIGN PATENT DOCUMENTS

| | | | | |
|---|---|---|---|---|
| EP | 1 391 882 A1 | * | 2/2004 | G11B/5/55 |

OTHER PUBLICATIONS

Destruction mechanism and destruction detection technique for multilayer ceramic actuators by Aburatani et al., IEEE 1995.*
Multi–layer bulk PZT actuactors for flying height control in ruggedised hard disk drives, Jenkins et al. IEEE 2001.*
Magnetic Disk Drive Technology by Dr. Kanu G. Ashar, copyright 1997 by the Institute of Electrical and Electronics Engineers, Inc.; pp. 285–288.

* cited by examiner

Primary Examiner—N. Le
Assistant Examiner—Walter Benson
(74) Attorney, Agent, or Firm—Marsh Fischmann & Breyfogle LLP (57) ABSTRACT

A test device and method for testing one of a disk drive microactuator and a disk drive sensor that includes two piezoelectric elements. The test device includes a signal generator, signal analyzer, and a user interface. The test device is operational to provide a reference signal (e.g. an electrical signal) to one of the piezoelectric elements in the microactuator and obtain a test measure from the other one of the piezoelectric elements. The test measure is then utilized to assess a performance parameter for the microactuator. The test measure is generated by the other one of the piezoelectric elements in response to the reference signal provided to the first one of the piezoelectric elements. In one embodiment of the invention, the test measure is a signal generated in response to the reference signal that may be compared to a known response signal of an operational microactuator to determine operational characteristics of a subject microactuator such as circuitry operation and/or damage to the microactuator.

30 Claims, 6 Drawing Sheets

FIG. 7

PEIZOELECTRIC MICROACTUATOR AND SENSOR FAILURE DETECTION IN DISK DRIVES

RELATED APPLICATIONS

This patent application is a continuation of Ser. No. 10/218,953, that was filed on Aug. 13, 2002 now abandoned, and that is entitled "PEIZOELECTRIC MICROACTUATOR AND SENSOR FAILURE DETECTION IN DISK DRIVES," and further claims priority from U.S. Pat. application Ser. No. 601345,037, that was filed on Oct. 23, 2001, and that is entitled "PZT MICROACTUATOR FAILURE DETECTION BY MEASURING PZT GENERATED VOLTAGE." The entire disclosure of U.S. Pat. application Ser. No. 601345,037 and U.S. Pat. application Ser. No. 10/218,953 is incorporated herein by reference.

FIELD OF THE INVENTION

The present invention generally relates to testing of disk drives, and more particularly, to testing and detecting failures in piezoelectric microactuators and piezoelectric sensors of disk drives.

BACKGROUND OF THE INVENTION

Conventional disk drives typically include a base plate and a cover that is detachably connected to the base plate to define an enclosure for various disk drive components. One or more data storage disks are generally mounted on a spindle which is rotatably interconnected with the base plate and/or cover so as to allow the data storage disk(s) to rotate relative to both the base plate and cover via a spindle motor. An actuator arm assembly (e.g., a single actuator arm, a plurality of actuator arms, an E-block with a plurality of actuator arm tips), is interconnected with the base plate and/or cover by an appropriate bearing or bearing assembly so as to enable the actuator arm assembly to pivot relative to both the base plate and cover in a controlled manner.

A suspension or load beam may be provided for each data storage surface of each data storage disk. Typically, each disk has two of such surfaces. All suspensions are appropriately attached to and extend away from the actuator arm assembly in the general direction of the data storage disk(s) during normal operations. A slider is mounted on the free end of each suspension. A transducer, such as a read/write head, is mounted (e.g., embedded) on each slider for purposes of exchanging signals with the corresponding data storage surface of the corresponding data storage disk. In this regard, each data storage surface of each data storage disk has a plurality of concentrically disposed tracks that are available for data storage. Typically, these tracks are circular and are concentrically disposed on a data storage disk of a disk drive.

For high track density drives, the position of the slider, and thereby each transducer, is often controlled by a "dual-stage actuation system". In such a system, a first stage including a voice coil motor or the like is utilized to provide a course positioning by pivoting the actuator arm assembly and each slider interconnected therewith to dispose the transducer(s) at a desired radial position relative to the corresponding data storage disk. In a second stage, a microactuator is utilized to further position the transducer(s) at a radial position over a desired track. In this regard, such microactuators typically operate to move the transducer radially over the disc surface for track seek operations and hold the transducer directly over a track on the disc surface for track following operations. One type of microactuator includes a pair of piezoelectric ("PZT") elements that expand and contract in response to an applied voltage to distort the slider to effect fine positioning of the transducer and slider relative to a desired track.

Disk drives also often include different systems to protect against damage to the data storage disk(s) and/or transducer(s) in the event that the disk drive is subject to a non-operational shock event or force ("shock event"). For instance, disk drives may include a sensor system that detects shock events and prevents read/write operations until the event has subsided. In another instance, disk drives may include an active damping system, which actively dampens vibrational energy from a shock event, to reduce damage. In either case, it is known to use piezoelectric materials in these systems. For example, in the case of shock sensors, it is known to use a pair of piezoelectric elements mounted on a disk drive housing to detect shock events and prevent read/write operations during such an event to prevent damage to the disk(s) and/or transducer(s).

Currently, several methods exist for testing microactuators and sensors that include piezoelectric materials. These methods generally include, measuring capacitance, performing visual checks, and/or measurement of a mechanical resonance using a Laser Doppler Vibrometer ("LDV") to generate a mechanical bode plot. Among these methods, the most reliable is the use of an LDV to measure mechanical resonance. The output of the LDV test (a bode plot representing the mechanical resonance characteristics) may then be compared to known resonance characteristics of an operational microactuator and/or to determine if the microactuator and/or sensor is functioning properly. In this regard, if the subject microactuator and/or sensor is damaged, such resonance characteristics will vary indicating that the subject microactuator and/or sensor should be further tested, usually via close visual inspection, for damage. LDV involves projecting a laser beam onto one of the PZT elements to sense and measure motion of the element that may be characterized in a graphical output, usually including a plot of the log of the frequency versus the measured vibration in decibels.

Unfortunately, however, LDV mechanical resonance measurement is inefficient in that it requires significant setup and positioning to align the laser beam on the measurement target (one of the PZT elements). Further, in some cases, such as within an environmental chamber or when a subject disk drive is completely sealed, LDV testing is not even possible without removing and/or disassembling the subject drive to expose the measurement target to the laser beam. In this regard, the average testing time for a single microactuator using the LDV method is on the order of about half an hour to an hour. This in turn oftentimes makes microactuator and/or sensor testing using LDV economically infeasible.

SUMMARY OF THE INVENTION

In view of the foregoing, a broad objective of the present invention is to provide a test device and method for testing PZT microactuators and/or sensors to detect failures in the same. Another object of the present invention is to provide a reliable yet efficient test device and method for testing PZT microactuators and/or sensors in disk drives prior to shipping the drives to a customer(s). A related objective is to provide a test device and method for measuring the mechanical resonance of PZT microactuators and/or sensors for comparison to a predetermined mechanical resonance for an operational PZT microactuator and/or sensor.

In carrying out the above objects, and other objects, features, and advantages of the present invention, a method for testing PZT microactuators and/or sensors in a disk drive in accordance with a first aspect is provided. A typical disk drive, to be discussed in more detail below, generally includes an appropriate housing (e.g., a base plate and/or cover that collectively define an enclosed space or the like). A data storage disk(s) is interconnected with this housing in a manner so as to allow the data storage disk to move (e.g., rotate) relative to the housing in a desired manner. That is, the present invention is applicable to disk drives having only a single data storage disk, as well as disk drives having a multiple data storage disk configuration and which are typically mounted on a common spindle motor or the like. An actuator arm assembly is also interconnected with the noted housing in a manner that allows the actuator arm assembly to move relative to the housing in a desired manner. A transducer is appropriately interconnected with the actuator arm assembly (e.g., via a suspension or load beam that extends from a rigid actuator arm, actuator arm tip, or E block, and a slider that is mounted on the free end of this suspension or load beam and which includes the noted transducer). Typically, there will be a transducer for each data storage surface of each data storage disk utilized by the disk drive, although the broadest aspects of the present invention do not require such. In any case, an actuator arm drive assembly appropriately interfaces with the actuator arm assembly in a manner so as to be able to move the actuator arm assembly and each transducer that is interconnected therewith to a desired position (e.g., in relation to a given transducer's corresponding data storage disk for exchange of a signal therebetween, such as for purposes of a read and/or write operation). In this regard, a microactuator and/or sensor having two PZT elements is also included in the disk drive at an operable location, which is irrelevant to the present method and device.

According to the first aspect of the present invention, a reference signal is provided to one of the two PZT elements in a microactuator or a sensor. A test measure is then obtained from the other PZT element that is utilized to assess a performance parameter for the microactuator or sensor. The test measure is generated by the other PZT element in response to the reference signal provided to the first PZT element.

Various refinements exist of the features noted in relation to the subject first aspect of the present invention. Further features may also be incorporated in the subject first aspect of the present invention as well. These refinements and additional features may exist individually or in any combination. For instance, the reference signal may be in the form of an electrical signal provided to one of the two PZT elements at a predetermined voltage. The test measure, on the other hand, may be a response signal, or voltage, received from the other one of the PZT elements in response to the reference signal passing through the first PZT element. In accordance with the first aspect, the test measure may be compared to a predetermined measure to assess a performance parameter(s) for the microactuator and or sensor. In this regard, the predetermined measure may be a known response signal for an operational microactuator and/or sensor. A comparison of the test measure to the predetermined measure may be utilized to determine if the current microactuator and/or sensor is damaged, as the resonant characteristics of a damaged microactuator and/or sensor will have changed so that the test measure does not correspond to the predetermined measure for an operational microactuator and/or sensor. Similarly, if on the other hand, the test measure corresponds to the predetermined response of an operational microactuator and/or sensor, it is known that the present microactuator and/or sensor is undamaged. Further, if no test measure is received in response to providing the reference signal to the first one of the PZT elements, it is known that a connection and/or the circuitry in the closed loop system is faulty.

In carrying out the above objects, and other objects, features, and advantages of the present invention, a test device for testing microactuators and/or sensors in a disk drive in accordance with a second aspect is provided. The test device includes a signal generator to generate the reference signal for the first one of the PZT elements and a signal analyzer to compare a response signal, e.g. frequency response, from another PZT element with a predetermined response signal for an operational microactuator and/or sensor. In this regard, the test device may also include a user interface to provide an output indicative of the comparison between the response signal and the predetermined response signal for an operational microactuator and/or sensor.

Various refinements exist of the features noted in relation to the subject second aspect in of the present invention. Further features may also be incorporated in the second aspect of the present invention as well. These refinements and additional features may exist individually or in any combination. For instance, the test device may further include a test control processor for generating and providing signals to the signal generator for setting the reference signal at a predetermined voltage. The test control processor may also be utilized to generate signals for setting the reference signal at a plurality of predetermined voltages that may be provided to the first one of the PZT elements to generate a corresponding plurality of response signals from the other one of the PZT elements.

Numerous additional features and advantages of the present invention will become apparent to those skilled in the art upon consideration of the further description that follows.

DETAILED DESCRIPTION

Reference will now be made to the accompanying drawings, which assist in illustrating the various pertinent features of the present invention. Although the present invention will now be described primarily in conjunction with disk drives, it should be expressly understood that the present invention may be applicable to other applications where testing of a PZT microactuator having two PZT elements is required/desired. Additionally, for purpose of clarity the present invention will now be described in conjunction with the testing of a disk drive microactuator having two piezoelectric elements. It will be appreciated, however, that the principles described below apply equally to testing of a disk drive sensor that includes two piezoelectric elements, although such discussion is omitted to avoid redundancy. In this regard, the following description of a disk drive is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain best modes known of practicing the invention and to enable others skilled in the art to utilize the invention in such, or other embodiments and with various modifications required by the particular application(s) or use(s) of the present invention.

Figure 1:
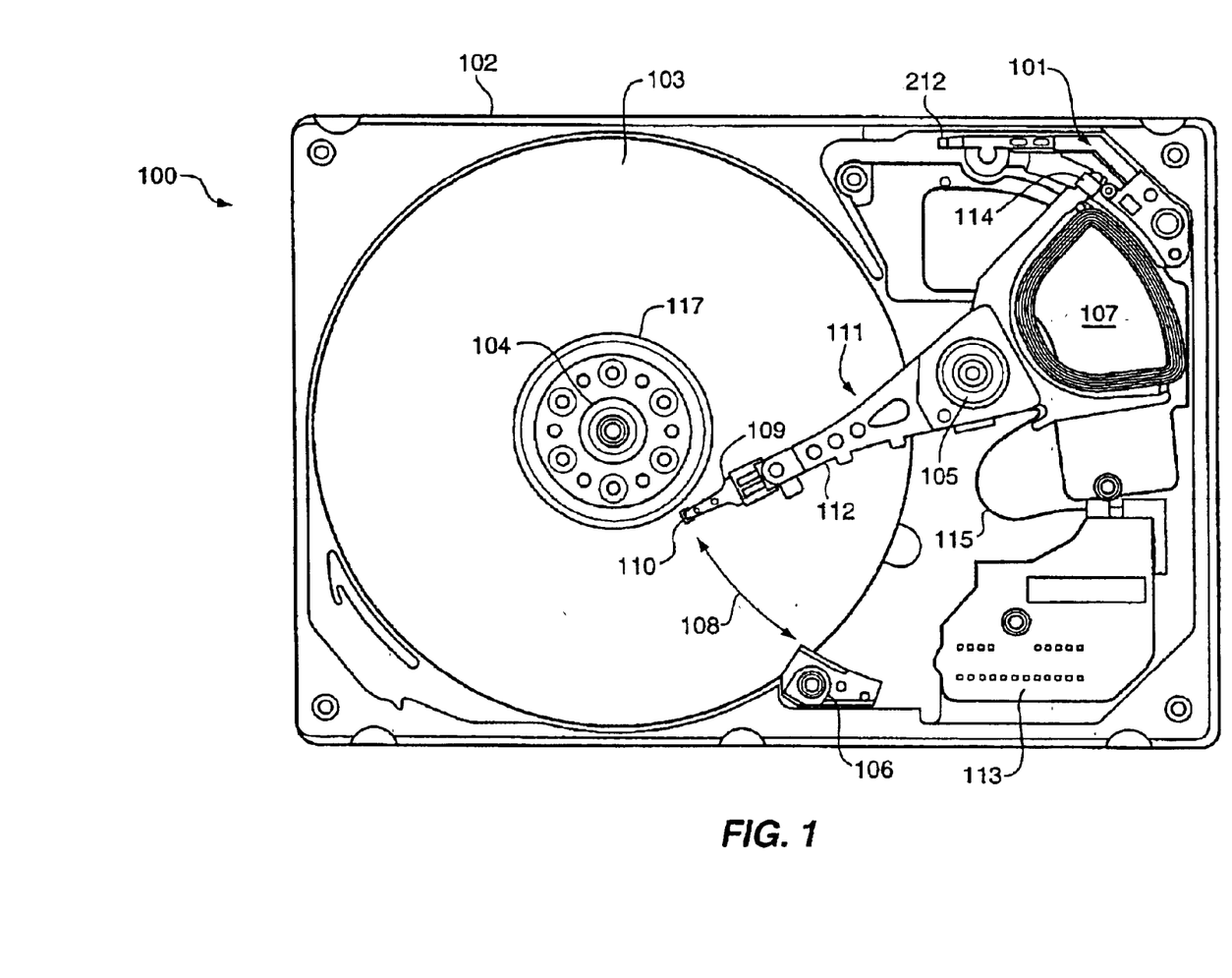
FIG. 1 is a top view of a disk drive that utilizes a microactuator having a pair of PZT elements.
Figure 2A:
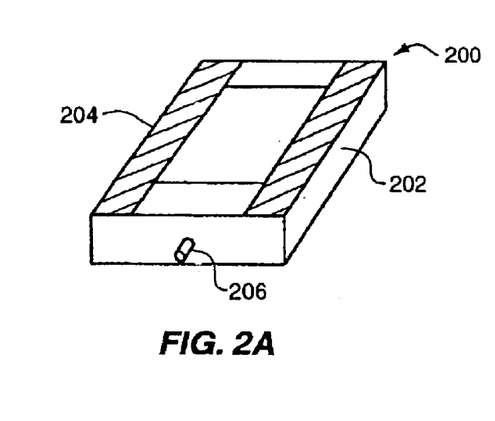
FIG. 2A is a top view of a microactuator for the disk drive of FIG. 1 that includes a pair of PZT elements.
Figure 2B:
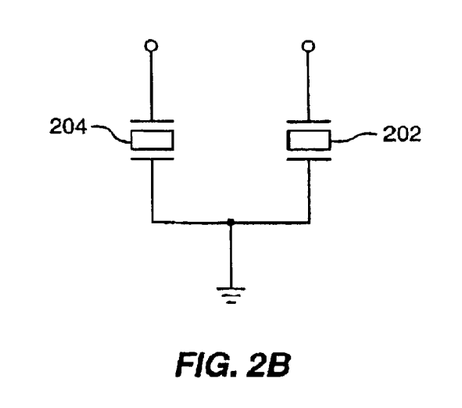
FIG. 2B is an example of an electrical schematic for the microactuator of FIG. 2A.

FIGS. 1, 2A, and 2B illustrate one embodiment of a disk drive 100 configured with a microactuator 200 having a pair of PZT elements, 202 and 204. The disk drive 100 generally includes a base plate 102 and a cover (not shown) that may be disposed on the base plate 102 to define an enclosed housing or space for the various disk drive components. The disk drive 100 includes one or more data storage disks 103 of any appropriate computerreadable data storage media. Typically, both of the major surfaces of each data storage disk 103 include a plurality of concentrically disposed tracks for data storage purposes. Each disk 103 is mounted on a hub or spindle 117, which in turn is rotatably interconnected with the disk drive base plate 102 and/or cover. Multiple data storage disks 103 would be mounted in vertically spaced and parallel relation on the spindle 117. Rotation of the disk(s) 103 is provided by a spindle motor 104 that is coupled to the spindle 117 to simultaneously spin the data storage disk(s) 103 at an appropriate rate.

The disk drive 100 also includes an actuator arm assembly 111 that pivots about a pivot bearing 105, which in turn is rotatably supported by the base plate 102 and/or cover. The actuator arm assembly 111 includes one or more individual rigid actuator arms 112 that extend out from near the pivot bearing 105. Multiple actuator arms 112 would be disposed in vertically spaced relation, with one actuator arm 112 typically being provided for each major data storage surface of each data storage disk 103 of the disk drive 100. Other types of actuator arm assembly configurations could be utilized as well, such as an "E" block having one or more rigid actuator arm tips or the like that cantilever from a common structure. In any case, movement of the actuator arm assembly 111 is provided by an actuator arm drive assembly, such as a voice coil motor 107 or the like. The voice coil motor 107 is a magnetic assembly that controls the operation of the actuator arm assembly 111 under the direction of control electronics 113. Any appropriate actuator arm assembly drive type may be utilized by the disk drive 100, including a linear drive (for the case where the actuator arm assembly 111 is interconnected with the base plate 102 and/or cover for linear movement versus the illustrated pivoting movement about the pivot bearing 105) and other types of rotational drives.

A load beam or suspension 109 is attached to the free end of each actuator arm 112 and cantilevers therefrom. Typically, the suspension 109 is biased generally toward its corresponding disk 103 by a spring-like force. A slider 110 is disposed at or near the free end of each suspension 109. What is commonly referred to as the "head" 206 (e.g., transducer) is appropriately mounted on the slider 110 and is used in disk drive read/write operations. A microactuator 200 is also appropriately mounted on the slider 110, as shown in FIG. 2A and in the circuit diagram of FIG. 2B. The microactuator 200 includes a pair of PZT elements, 202 and 204, that are differentially driven to achieve fine positioning of the head 206 relative to a desired track on the corresponding disk 103. In this regard, differential voltages are applied to the PZT elements, 202 and 204, to cause opposing expansion and contraction of the elements, 202 and 204, to effect movements of the slider 110 and position the head 206 over a desired track on the corresponding disk 103.

The head 206 on the slider 110 may utilize various types of read/write technologies. The biasing forces exerted by the suspension 109 on its corresponding slider 110 thereby attempt to move the slider 110 in the direction of its corresponding disk 103. Typically, this biasing force is such that if the slider 110 were positioned over its corresponding disk 103, without the disk 103 being rotated at a sufficient velocity, the slider 110 would be in contact with the disk 103.

The head 206 and microactuator 200 are interconnected with the control electronics 113 of the disk drive 100 by a flex cable 115 that is typically mounted on the actuator arm assembly 111. Signals are exchanged between the head 206 and its corresponding data storage disk 103 for disk drive read/write operations. Similarly, signals are exchanged between the microactuator 200 to position the head 206 for such read write operations. In this regard, the voice coil motor 107 is utilized to pivot the actuator arm assembly 111 to simultaneously move the head 206 on its slider 110 along a path 108 and "across" the corresponding data storage disk 103 to position the head 206 at the desired/required radial position on the disk 103 (i.e., at the approximate location of the correct track on the data storage disk 103) for disk drive read/write operations.

When the disk drive 100 is not in operation, the actuator arm assembly 111 is pivoted to a "parked position" to dispose each slider 110 generally at or beyond a perimeter of its corresponding data storage disk 103, but in any case in vertically spaced relation to its corresponding disk 103. This is commonly referred to in the art as being a dynamic load/unload disk drive configuration. In this regard, the disk drive 100 includes a ramp assembly 106 that is disposed beyond a perimeter of the data storage disk 103 to typically both move the corresponding slider 110 vertically away from its corresponding data storage disk 103 and to also exert somewhat of a retaining force on the actuator arm assembly 111. Any configuration for the ramp assembly 106 that provides the desired "parking" function may be utilized. The disk drive 100 could also be configured to be of the contact start/stop type, where the actuator arm assembly 111 would pivot in a direction to dispose the slider(s) 110 typically toward an inner, non-data storage region of the corresponding data storage disk 103. Terminating the rotation of the data storage disk(s) 103 in this type of disk drive configuration would then result in the slider(s) 110 actually establishing contact with or "landing" on their corresponding data storage disk 103, and the slider 110 would remain on the disk 103 until disk drive operations are re-initiated. In either configuration, it may be desirable to attempt to retain the actuator arm assembly 111 in this parked position if the disk drive 100 is exposed to a shock event. In this regard, the disk drive 100 includes an actuator arm assembly latch 101 that moves from a non-latching position to a latching position to engage the actuator arm assembly 111 to preclude the same from pivoting in a direction that would tend to drag the slider(s) 110 across their corresponding data storage disk 103.

Figure 3:
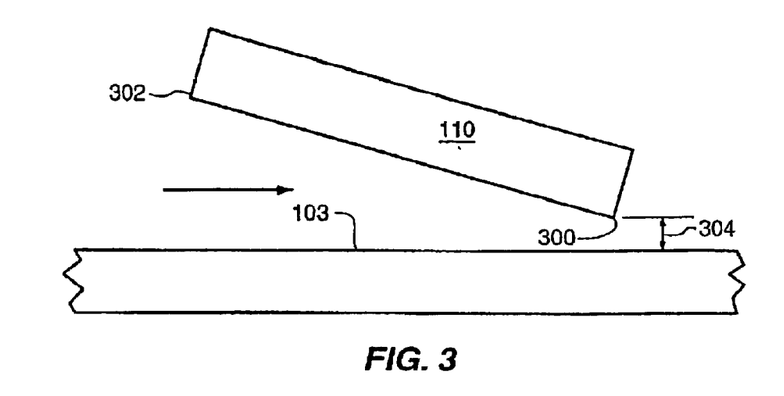
FIG. 3 is a schematic diagram illustrating operation of a transducer in the disk drive of FIG. 1.

The slider 110 of the disk drive 100 may be configured to "fly" on an air bearing during rotation of its corresponding data storage 103 at a sufficient velocity. This is schematically illustrated in FIG. 3. Here the arrow represents the direction of rotation of the disk 103 relative to the slider 110, while the fly height of the slider 110 is represented by reference numeral 304 (measured from a reference plane of the mean of the surface roughness of the disk 103). In FIG. 3, the slider 110 is disposed at a pitch angle such that its leading edge 302 of the slider 110 is disposed further from its corresponding data storage disk 103 than its trailing edge 300. The head 206 would typically be incorporated on the slider 110 generally toward its trailing edge 300 since this is positioned closest to its corresponding disk 103. Other pitch angles could be utilized for flying the slider 110.

Figure 4:
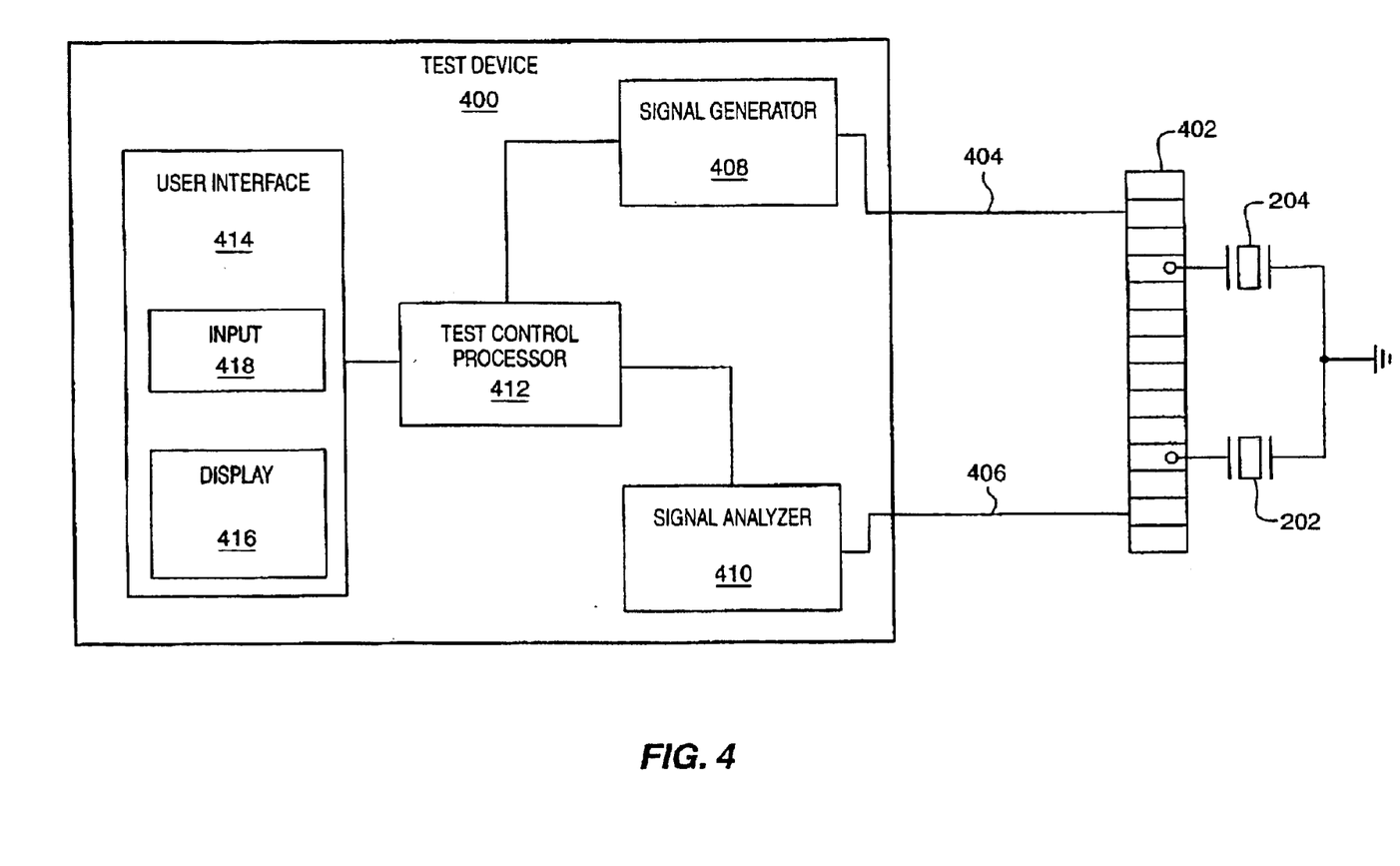
FIG. 4 is a block diagram illustrating an example of the test device according to one or more aspects of the present invention.

Referring to FIG. 4, to allow for assessment of the performance of the microactuator 200, one embodiment of the present invention provides for the use of an externally positioned (relative to the disk drive 100) test device 400. The test device 400 is electrically connected to the piezoelectric elements, 202 and 204, via a closed loop circuit. Specifically, the test device 400 includes a connector 402. The connector 402 is of the type commonly used in the art to connect to a conventional flex cable connector included on the disk drive 100 for connection to a PCBA board of a disk drive. In other words, the connector 402 is of the type utilized on PCBA boards for the connection of the disk drive 100. In this regard, leads 404 and 406 from the test device 400 connect to the corresponding pins within the connector 402 that are matched to the microactuator 200. Advantageously, the use of the conventional flex cable connector on the disk drive 100 for the connection of the test device 400 eliminates the prior art requirement of having to remove and/or disassemble a subject disk drive, e.g. 100, to expose the microactuator 200.

To provide for testing of the microactuator 200, the test device 400 includes a signal generator 408 to provide an input electrical signal, e.g. a reference signal, over the path 404 to one of the piezoelectric elements 202 and 204. More particularly, the test device 400 also includes a test control processor 412 and signal analyzer 410. The test control processor 412 provides signals for setting the signal generator 408 to output the reference signal at a predetermined voltage. The test control processor 412 also provides the reference signal characteristics to the signal analyzer 410, which stores the reference signal characteristics for assessing the performance of the microactuator 200, as will be further discussed below. In this regard, the test control processor 412 may also provide signals for setting the signal generator 408 to output the reference signal that may be swept across a predetermined voltage range for purposes discussed further below. The reference signal may be any signal capable of exciting one of the piezoelectric elements 202 and 204. Some examples of the reference signal include without limitation, a swept sine, periodic chirp, or random noise.

The signal analyzer 410, in turn, analyzes a response electrical signal generated by the other one of the piezoelectric elements, 202 and 204, in response to the input reference signal by the signal generator 408. As will become apparent from the following description, the signal analyzer 410 performs comparisons of the reference signal characteristics and the response signal characteristics that are usable to determine performance characteristics of the microactuator 200. In this regard, the test device 400 also includes a user interface 414 that includes a display 416 for displaying the results of the signal comparisons made by the signal analyzer 410. The user interface 414 also includes an input module 418 for receiving inputs from a user providing instruction to the test control processor 412 with regard to setting the reference signal.

Figure 5:
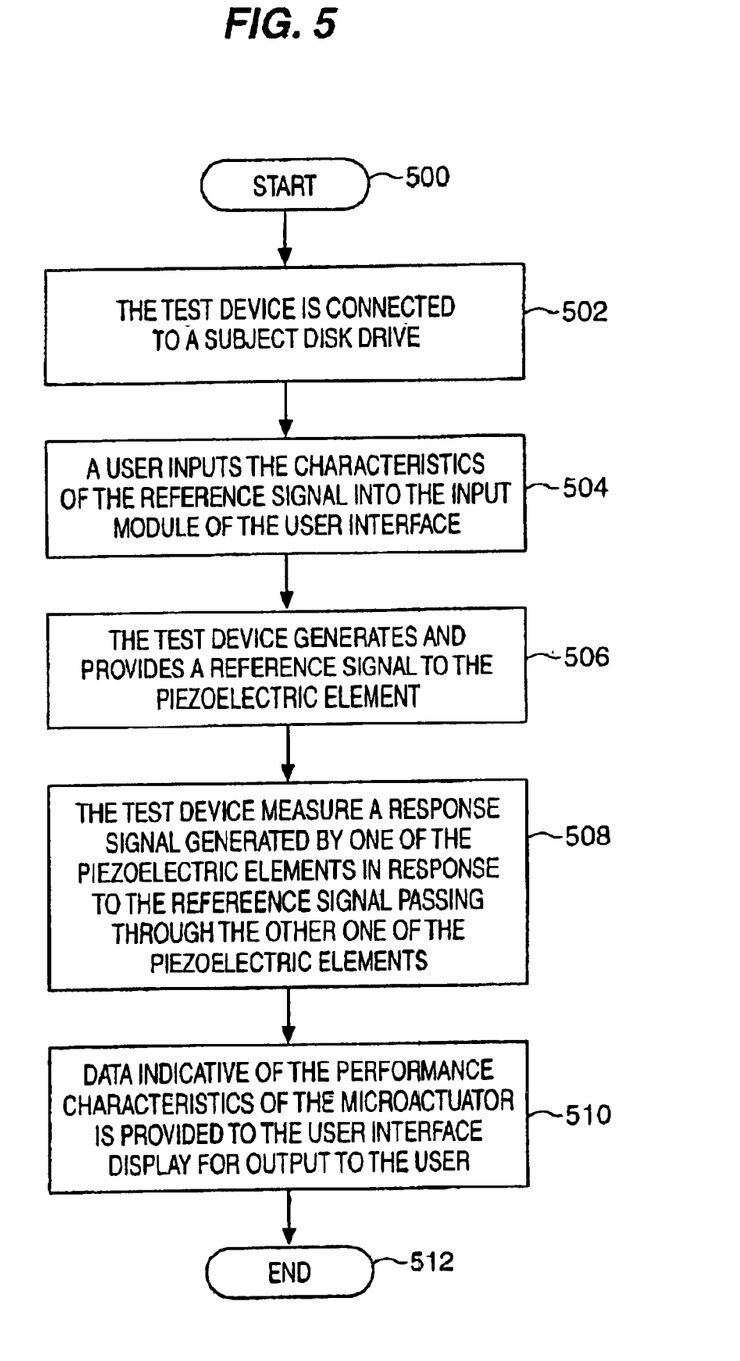
FIG. 5 is flow chart depicting an example of an operational protocol according to the present invention.
Figure 6:
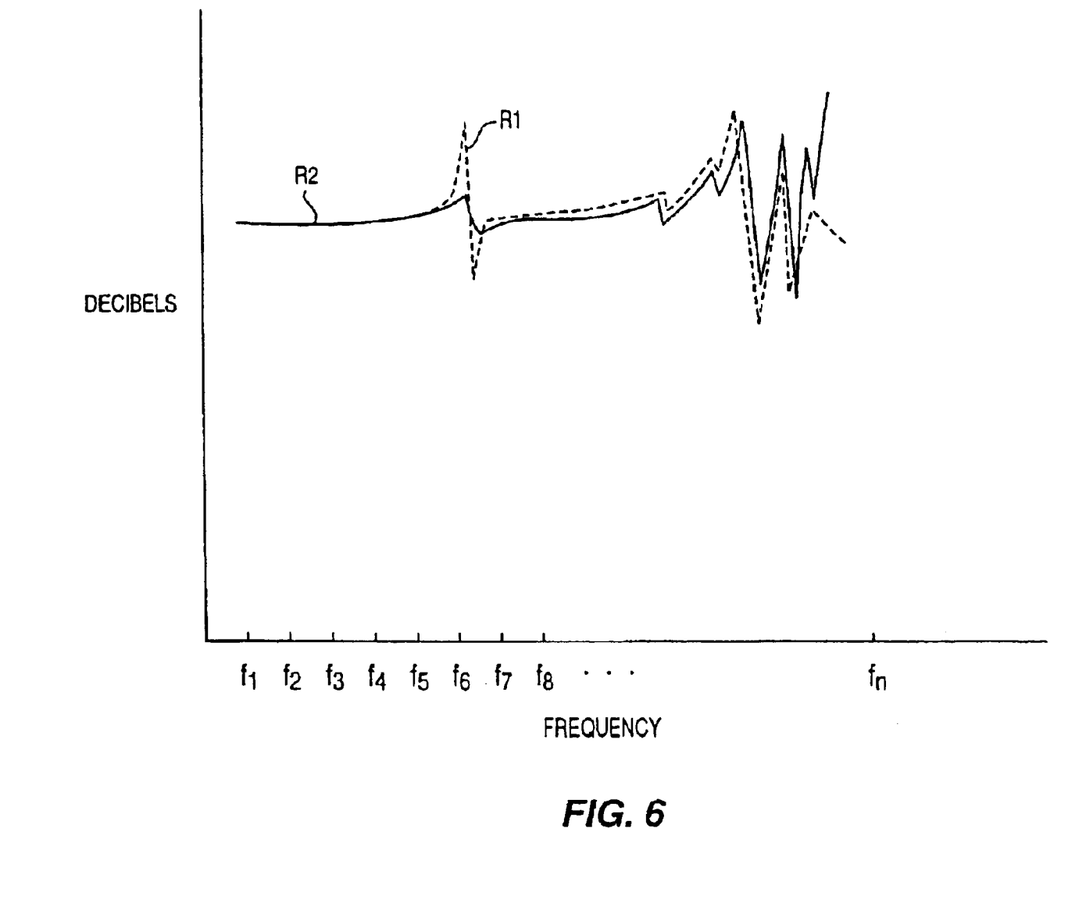
FIG. 6 is a bode plot illustrating a comparison of a test measure obtained in accordance with the present invention and a predetermined measure of an operational microactuator.

FIG. 5 is a flow chart illustrating an example of an operational protocol according to the present invention. FIG. 6 is an example of an output provided by the signal analyzer 410 to the display 416. In the example illustrated in FIG. 5, the reference signal is provided to the piezoelectric element 202 and the response signal is generated by the piezoelectric element 204. Alternatively, as will be appreciated, the present protocol works equally well where the reference signal is provided to the piezoelectric element 204 and the response signal is generated by the piezoelectric element 202.

On FIG. 5, the operation begins at step 500. At step 502 the test device 400 is connected to a subject disk drive, e.g. drive 100, via the connector 402, by plugging the connector 402 into the flex cable connector on the drive 100. At step 504, a user inputs the characteristics of the reference signal into the input module 418 of the user interface 415. At step 506, the test device 400 generates and provides a reference signal to the piezoelectric element 202 over the lead 404. More specifically, the test control processor 412 provides signals to the signal generator 408 according to inputs from the user at the input module 418. In turn, the signals from the test control processor 412 set the signal generator 408 to output a reference signal at a predetermined voltage.

At step 508, the test device 400 measures a frequency response signal (e.g. voltage) generated by the piezoelectric element 204 in response to the reference signal (e.g. voltage) passing through the piezoelectric element 202. The response signal, and more particularly, the generated voltage by element 202, in turn, is directly related to the electrical single passing through the piezoelectric element 202. The electrical signal passing through the element 202 is in turn, related to the mechanical characteristics of the piezoelectric elements 202 and 204. In other words, the application of the electrical signal or voltage to the piezoelectric element 202 induces a mechanical strain in the element 202 that is transmitted to the piezoelectric element 204, thereby generating a responsive voltage in the piezoelectric elements 204. At step 510, data indicative of the performance characteristics of the microactuator 200 is provided to the user interface 414, and specifically to the display 416 for output to a user. At step 512, the operation ends.

In this regard, micro-actuators, such as microactuator 200, are formed by depositing and/or forming one or more thin layers of PZT film onto a layer of substrate material. The substrate material is shaped to provide the structural support for the microactuator 200, while the PZT layers provide the force to actuate the system, in this case fine positioning of the head 206. In this regard, the resonant characteristics of the microactuator 200 will change if there is any damage to the microactuator 200. As such, the resultant response voltage generated by the piezoelectric element 204, in response to the reference signal passing through the piezoelectric elements 202, may be utilized to assess whether the microactuator 200 is operative and further whether the microactuator 200 is damaged.

In this regard, test device 400, and specifically the signal analyzer 410, uses predetermined data regarding the response signal to generate the data indicative of the assessment results for the display 416. For instance, it will be appreciated that a response signal from the piezoelectric element 204 is predeterminable for a given reference signal provided to the piezoelectric element 202 in an operable microactuator 200. Thus, a predetermined response signal for the piezoelectric element 204 may be employed to assess the performance of the microactuator 200. For instance to determine operational characteristics of the microactuator 200, a comparison of the actual response signal from the element 204 to the known, or predetermined, response signal from the element 204 may be utilized. In a preferred example, a comparison of the gain in decibels, which is a logarithmic measure of a voltage ratio to the frequency of the input electrical signal, may be utilized. Such comparisons are conventionally provided in the form of a bode plot consisting of the log of the gain as a function of the log of the input frequency as illustrated in FIG. 6.

Figure 7:
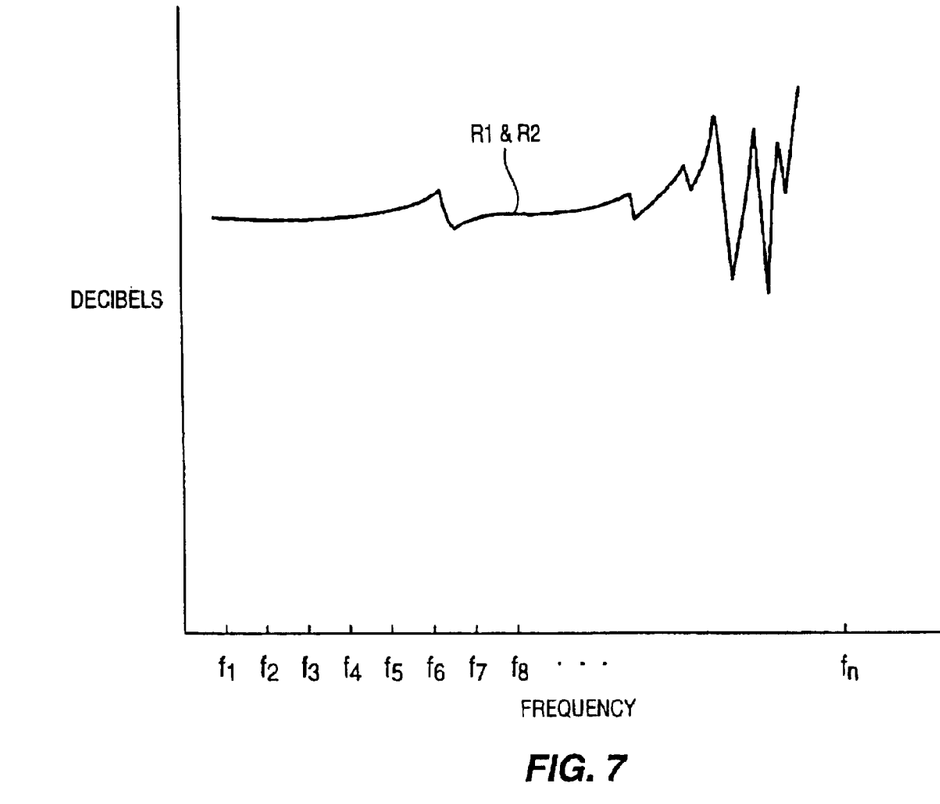
FIG. 7 is another bode plot illustrating a comparison of a test measure obtained in accordance with the present invention and a predetermined measure of an operational microactuator.

In this regard, a comparison of a response signal (R1) from the piezoelectric element 204 to a known expected response signal (R2) for the piezoelectric element 204, provides a fast efficient method of determining operational characteristics of the microactuator 200. For instance, the receipt of the response signal (R1) provides a preliminary assessment of the performance of microactuator 200, e.g. an indication that the circuitry of the microactuator 200 is operational. In other words, if the response signal (R1) is not received, then it may be determined that one or more connections or circuitry components of the microactuator 200 are faulty. In the event that the preliminary assessment indicates that the circuitry and interconnections appear operational, the process may continue to further assess the performance of the microactuator 200 by the comparison of the response signal (R1) with the known expected response signal (R2). Thus, in the case illustrated on FIG. 6, where the response signal (R1) and the expected response signal (R2) do not correspond, it is known that the microactuator 200 is damaged as the resonant characteristics of the microactuator 200 have changed. In other words, if the microactuator 200 is not damaged, the response signal from the piezoelectric element 204 will correspond at least substantially to the predetermined or known response signal expected from an operational microactuator 200 as illustrated in FIG. 7, where no or substantially no distinction exists between the response signal (R1) and predetermined response signal (R2). In this regard, a magnitude range or frequency shift range may also be utilized wherein if the response signal (R1) is within the range, it may be determined that the microactuator 200 is not damaged and if the response signal (R1) is outside of the range the microactuator 200 is damaged.

In another approach, a plurality of response signal measurements may be made in corresponding relation to the setting of the reference signal at a corresponding plurality of different voltages e.g., high to low or low to high voltages. Such sweeping of the reference signal yields a plurality of response signal measurements from which performance characteristics, e.g. damage and circuitry operation may be identified through analysis of the expected responses signals e.g. (R2) and the received responses signals, e.g. (R1).

Alternatively, measurement of the frequency response of the piezoelectric element 204 may be made for only a small range or window of the expected response signal (R2) where the microactuator is sensitive to the reference signal. For instance, with reference to FIG. 6, measurement of the frequency response signal (R1) may be taken for the window including the first peak in (R2) between frequencies $f_5$ and $f_8$. Advantageously, measurement over smaller ranges of the expected response signal (R2) shortens testing time and permits selection of ranges where the piezoelectric element 204 is especially sensitive to the reference signal. As with the above example a frequency shift range or magnitude range may be defined for the response signal (R1) wherein if the response signal (R1) is within the range, it may be determined that the microactuator 200 is not damaged and if the response signal (R1) is outside of the range the microactuator 200 is damaged.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A method for making a disk drive comprising testing one of a disk drive microactuator and a disk drive sensor that includes a pair of piezoelectric elements, the method comprising the steps of:

providing a reference signal to a first one of the pair of piezoelectric elements;

obtaining a test measure for the second one of the pair of piezoelectric elements, wherein the test measure is generated by the second one of the pair of piezoelectric elements in response to the reference signal provided to the first one of the piezoelectric elements; and employing the test measure to assess a performance parameter of the one of the disk drive microactuator and the disk drive sensor.

2. The method of claim 1 wherein the step of employing includes:

comparing the test measure to a predetermined measure to assess the performance parameter of the one of the disk drive microactuator and the disk drive sensor.

3. The method of claim 2 comprising the step of:

providing an output indicative of the comparison of the test measure to the predetermined measure.

4. The method of claim 1 wherein the step of providing the reference signal includes:

providing an electrical signal at a predetermined voltage to generate the test measure for the second one of the pair of piezoelectric elements.

5. The method of claim 4 wherein the step of providing the electrical signal includes:

providing the electrical signal at a plurality of different voltages distributed across a predetermined range to generate a plurality of test measures from the second one of the pair of piezoelectric elements.

6. The method of claim 5 wherein the test measure and the plurality of test measures comprise:

a frequency response signal from the second one of the pair of piezoelectric elements generated in response to the electrical signal passing through the first one of the pair of piezoelectric elements.

7. The method of claim 1 wherein the performance parameter comprises:

functionality of circuitry for the one of the disk drive microactuator and the disk drive sensor.

8. The method of claim 1 wherein the performance parameter comprises:

physical damage to the one of the disk drive microactuator and the disk drive sensor.

9. The method of claim 1 wherein the step of providing the reference signal includes:

providing the reference signal to a flex cable connector of a fully assembled disk drive.

10. The method of claim 9 wherein the step of obtaining the test measure includes:

obtaining the test measure from the flex cable connector of the fully assembled disk drive.

11. A method for making a disk drive comprising testing one of a disk drive microactuator and a disk drive sensor that includes a pair of piezoelectric elements, the method comprising the steps of:

connecting a test device to the disk drive;

utilizing the test device to provide an electrical signal to a first one of the pair of piezoelectric elements;

utilizing the test device to obtain a test measure for the second one of the pair of piezoelectric elements, wherein the test measure is generated by the second one of the pair of piezoelectric elements in response to the electrical signal provided to the first one of the piezoelectric elements; and employing the test measure to assess a performance parameter of the one of the disk drive microactuator and the disk drive sensor.

12. The method of claim 11 wherein the step of connecting the test device to the disk drive comprises:

connecting the test device to a flex cable connector on the disk drive.

13. The method of claim 11 wherein the step of employing includes:

utilizing the test device to compare the test measure to a predetermined measure to assess the performance parameter of the one of the disk drive microactuator and the disk drive sensor.

14. The method of claim 13 comprising the step of:

providing an output on a user interface of the test device indicative of the comparison of the test measure and the predetermined measure.

15. The method of claim 11 wherein the step of utilizing the test device to provide the electrical signal includes:

providing the electrical signal at a predetermined voltage to generate the test measure in the second one of the pair of piezoelectric elements.

16. The method of claim 15 wherein the step of utilizing the test device to provide the electrical signal includes:

providing the electrical signal at a plurality of different voltages distributed across a predetermined range to generate a plurality of test measures in the second one of the pair of piezoelectric elements.

17. The method of claim 16 wherein the corresponding test measure and the corresponding plurality of test measures comprises:

a frequency response signal of the second one of the pair of piezoelectric elements to the electrical signal passing through the first one of the pair of piezoelectric elements.

18. The method of claim 11 wherein the performance parameter comprises:

functionality of circuitry for the one of the disk drive microactuator and the disk drive sensor.

19. The method of claim 11 wherein the performance parameter comprises:

physical damage to the one of the disk drive microactuator and the disk drive sensor.

20. A method for making a disk drive comprising testing one of a disk drive microactuator and a disk drive sensor that includes a pair of piezoelectric elements, the method comprising:

providing a voltage to one of the pair of piezoelectric elements;

measuring a second voltage generated by a second one of the pair of piezoelectric elements in response to the first voltage applied to the first one of the pair of piezoelectric elements; and comparing the measured voltage to a predetermined measure to determine a performance characteristic of the one of the disk drive microactuator and the disk drive sensor.

21. The method of claim 20 comprising the step of:

providing an output to a user indicative of the comparison of the measured voltage and the predetermined measure.

22. The method of claim 20 wherein the step of providing the voltage includes:

providing a plurality of different voltages distributed across a predetermined range to generate a corresponding plurality of voltages in the second one of the pair of piezoelectric elements.

23. The method of claim 20 wherein the performance parameter comprises:

operation of circuitry for the one of the disk drive microactuator and the disk drive sensor.

24. The method of claim 20 wherein the other performance parameter comprises:

physical damage to the one of the disk drive microactuator and the disk drive sensor.

25. A test device for testing one of a disk drive microactuator and a disk drive sensor that includes a pair of piezoelectric elements, the device comprising:

a signal generator to generate and provide a reference signal to a first one of the pair of piezoelectric elements;

a signal analyzer to obtain a response signal from the second one of the pair of piezoelectric elements generated in response to the reference signal passing through the first one of the pair of piezoelectric elements and compare the generated response signal to a predetermined response signal for the second one of the pair of piezoelectric elements; and a user interface to provide an output indicative of the comparison between the generated response signal and the predetermined response signal, wherein the comparison is indicative of a performance parameter for the one of the disk drive microactuator and the disk drive sensor.

26. The test device of claim 25 comprising:

a test control processor to generate and provide signals for setting the signal generator to provide the reference signal at a predetermined voltage to generate a corresponding response signal from the second one of the pair of piezoelectric elements.

27. The test device of claim 26 wherein the test control processor is configured to generate and provide signals for setting the signal generator to provide the reference signal at a plurality of predetermined voltages to generate a corresponding plurality of response signals in the second one of the pair of piezoelectric elements.

28. The test device of claim 25 wherein the response signal comprises:

a measured voltage generated by the second one of the pair of piezoelectric elements in response to the electrical signal passing through the first one of the pair of piezoelectric elements.

29. The method of claim 25 wherein the performance parameter comprises:

operation of circuitry for the one of the disk drive microactuator and the disk drive sensor.

30. The method of claim 26 wherein the performance parameter comprises:

physical damage to the one of the disk drive microactuator and the disk drive sensor.

* * * * *

UNITED STATES PATENT AND TRADEMARK OFFICE
CERTIFICATE OF CORRECTION

PATENT NO. : 6,861,854 B1
DATED : March 1, 2005
INVENTOR(S) : Guo et al.

It is certified that error appears in the above-identified patent and that said Letters Patent is hereby corrected as shown below:

<u>Title page, Item [54] and Column 1, lines 1 and 9,</u>
Title, please delete "PEIZOELECTRIC", and insert therefor
-- PIEZOELECTRIC -- .

<u>Column 5,</u>
Line 33, delete "computerreadable", and insert therefor -- computer-readable --.

Signed and Sealed this

Tenth Day of May, 2005

JON W. DUDAS
*Director of the United States Patent and Trademark Office*